(12) United States Patent
Taha et al.

(10) Patent No.: US 10,622,064 B2
(45) Date of Patent: Apr. 14, 2020

(54) MEMRISTOR CROSSBAR CONFIGURATION

(71) Applicant: University of Dayton, Dayton, OH (US)

(72) Inventors: Tarek M. Taha, Dayton, OH (US); Chris Yakopcic, Dayton, OH (US)

(73) Assignee: University of Dayton, Dayton, OH (US)

( * ) Notice: Subject to any disclaimer, the term of this patent is extended or adjusted under 35 U.S.C. 154(b) by 0 days.

(21) Appl. No.: 16/257,739

(22) Filed: Jan. 25, 2019

(65) Prior Publication Data

US 2019/0228822 A1 Jul. 25, 2019

Related U.S. Application Data

(60) Provisional application No. 62/622,116, filed on Jan. 25, 2018.

(51) Int. Cl.

| | |
|---|---|
| *G11C 11/00* | (2006.01) |
| *G11C 13/00* | (2006.01) |
| *H01L 27/24* | (2006.01) |
| *G11C 15/00* | (2006.01) |
| *G11C 15/04* | (2006.01) |

(52) U.S. Cl.
CPC .......... *G11C 13/004* (2013.01); *G11C 13/003* (2013.01); *G11C 13/0007* (2013.01); *G11C 13/0069* (2013.01); *G11C 15/00* (2013.01); *G11C 15/046* (2013.01); *H01L 27/2409* (2013.01); *H01L 27/2463* (2013.01); *G11C 2213/77* (2013.01)

(58) Field of Classification Search
CPC . G11C 13/004; G11C 13/0007; G11C 13/003; G11C 13/0069

USPC .......................................................... 365/148
See application file for complete search history.

(56) References Cited

U.S. PATENT DOCUMENTS

| | | |
|---|---|---|
| 7,675,765 B2 | 3/2010 | Derharcobian et al. |
| 7,782,646 B2 | 8/2010 | Lam et al. |
| 8,023,299 B1 | 9/2011 | Gharia |

(Continued)

OTHER PUBLICATIONS

S. H. Jo, K.-H. Kim, and W. Lu; "High-Density Crossbar Arrays Based on a Si Memristive System"; Nano Letters, 9(2);2009; pp. 870-874.

(Continued)

*Primary Examiner* — Vu A Le
(74) *Attorney, Agent, or Firm* — Thomas E. Lees, LLC

(57) ABSTRACT

A crossbar circuit determines a match of N bits of data to at least one of M target words simultaneously. The circuit comprises N inputs (one per data bit) and M outputs (one per target word). For each of the M target words, the circuit comprises N−1 biased bits, where each biased bit includes a first data memristor coupled to a corresponding one of the N inputs; a second data memristor coupled to the corresponding one of the N inputs, where the corresponding one of the N inputs is inverted before reaching the second data memristor; and two biasing memristors. Further, the circuit comprises a general bit comprising a first data memristor coupled to the input that does not correspond to any of the biased bits; and a second data memristor coupled to the input that does not correspond to any of the biased bits and is inverted.

11 Claims, 10 Drawing Sheets

(56) References Cited

U.S. PATENT DOCUMENTS

| | | | |
|---|---|---|---|
| 8,917,537 B2* | 12/2014 | Ordentlich | G11C 13/0007 365/148 |
| 9,455,030 B1* | 9/2016 | Wu | G11C 7/1006 |
| 2011/0002151 A1 | 1/2011 | Javerliac et al. | |
| 2013/0054886 A1 | 2/2013 | Eshraghian et al. | |
| 2017/0221560 A1* | 8/2017 | Hu | G06G 7/122 |

OTHER PUBLICATIONS

T.M. Taha, R. Hasan, and C. Yakopcic; "Memristor Crossbar Based Multicore Neuromorphic Processors"; IEEE International SOCC; 2014; pp. 383-389.

Y.-D. Kim, H.-S. Ahn, J.-Y. Park, S. Kim, and D.-K. Jeong; "A Storage- and Power-Efficient Range-Matching TCAM for Packet Classification"; IEEE Int. Solid-State Circuits Conf. (ISSCC); 2006.

P.-T. Huang, and W. Hwang; "A 65 nm 0.165 fJ/Bit/Search 256 x 144 TCAM Macro Design for IPv6 Lookup Tables"; IEEE J. of Solid-State Circuits, 46(2); Feb. 2011; pp. 507-519.

L. Zheng, S. Shin, S. Lloyd, M. Gokhale, K. Kim, and S.-M. Kang; "RRAM-Based TCAMs for Pattern Search"; IEEE ISCAS; 2016; pp. 1382-1385.

W. Xu, T. Zhang, and Y. Chen; "Design of Spin-Torque Transfer Magnetoresistive RAM and CAM/TCAM with High Sensing and Search Speed"; IEEE Trans. VLSI Systems, 18(1); Jan. 2010; pp. 66-74.

M.E. Baraji, V. Javerliac, and G. Prenat; "Towards an ultra-low power, high density and non-volatile Ternary CAM"; NVMTS; 2008; pp. 1-7.

Arizona State University Nanoscale Integration and Modeling (NIMO) Group: http://ptm.asu.edu/; downloaded Jan. 24, 2019.

M.N. Kozicki, M. Balakrishnan, C. Gopalan, C. Ratnakumar, and M. Mitkova; Programmable Metallization Cell Memory Based on Ag—Ge—S and Cu—Ge—S Solid Electrolytes; Non-Volatile Memory Technology Symposium; 2005; pp. 83-89.

C. Yakopcic, R. Hasan, T.M. Taha, and D. Palmer; "SPICE Analysis of Dense Memristor Crossbars for Low Power Neuromorphic Processor Designs"; IEEE NAECON; 2015; pp. 305-311.

\* cited by examiner

TABLE 1

| TCAM System | Kim CMOS | Huang CMOS | Zheng RRAM | Xu MRAM | Memristor |
|---|---|---|---|---|---|
| Configuration | 512×144 | 256×144 | 256×144 | 256×144 | 256×144 |
| Technology (nm) | 130 | 65 | 180 | 180 | 45 |
| Search Time (ns) | 4.8 | .38 | 2.3 | 8 | 1 |
| Energy Metric (fJ/bit/search) | 0.59 | 0.165 | 3 | 7.4 | 2.15 |
| Area (mm$^2$) | 2.55 | 0.434 | 0.167 | 1.548 | 0.0012 |
| Normalized Area Factor | 255 | 173 | 8.7 | 80.6 | 1 |

FIG. 6

MEMRISTOR CROSSBAR CONFIGURATION

CROSS REFERENCE TO RELATED APPLICATIONS

This application claims the benefit of U.S. Provisional Patent Application Ser. No. 62/622,116, filed Jan. 25, 2018, entitled "MEMRISTOR CROSSBAR CONFIGURATION", the disclosure of which is hereby incorporated by reference.

BACKGROUND

The present disclosure relates generally to memory hardware and, more particularly, to memristors.

Computing systems have become ubiquitous and the demand for memory hardware has increased due to the many diverse applications of computing systems. As use of computing systems increases, there is a corresponding need to reduce power consumption and a size of the devices.

SUMMARY

According to aspects of the present disclosure, a crossbar circuit determines a match of N bits of data to at least one of M target words simultaneously. The circuit comprises N inputs (one per data bit) and M outputs (one per target word). For each of the M target words, the circuit comprises N−1 biased bits, where each biased bit includes a first data memristor coupled to a corresponding one of the N inputs; a second data memristor coupled to the corresponding one of the N inputs, where the corresponding one of the N inputs is inverted before reaching the second data memristor; and two biasing memristors. Further, the circuit comprises a general bit comprising a first data memristor coupled to the input that does not correspond to any of the biased bits; and a second data memristor coupled to the input that does not correspond to any of the biased bits and is inverted.

Other systems, devices, methods, features, and advantages will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIG. 6 shows a table comparing one embodiment of the disclosed system with several other memory configurations.

DETAILED DESCRIPTION OF THE EMBODIMENTS

Figures 1A, 1B:
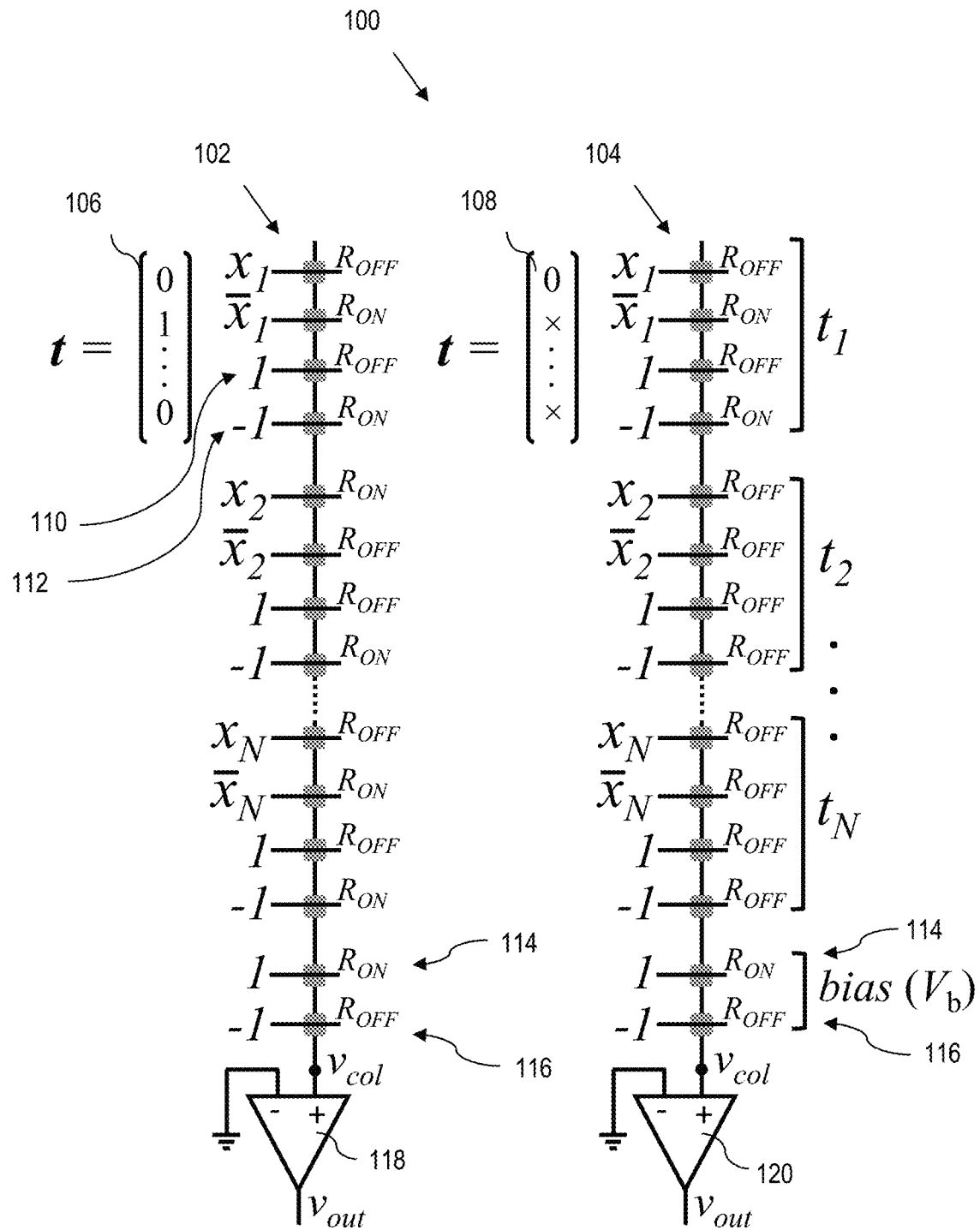
FIGS. 1A-B show two circuits including (a) an embodiment of a circuit diagram and a programming layout that serves as a basis for precise string matching, and (b) an embodiment of a circuit diagram and a programming layout that serves as a basis for string matching with "don't care" values.

In general, circuits are disclosed herein, which are capable of highly parallel string matching. For instance, string matching is required in many applications including cyber-security (malicious packet identification on a network), ternary content-addressable memory (TCAM) arrays, decision making systems that require a bank of available actions, etc. In this regard, in certain embodiments, circuits are provided that utilize memristor crossbar-based techniques for highly parallel string matching. In some embodiments, such circuits have a significantly lower area when compared to alternative circuit designs, and in some cases (e.g., in a low frequency mode), the circuits also provide significant power savings. As such, circuits and systems herein can be used anywhere a low power search function or a low area (i.e., silicon die size) search function is needed.

Before describing embodiments of circuits for string matching, an example application is provided for context. As an illustrative but non-limiting example, there is currently a desire to achieve cognitive capabilities in unmanned aerial vehicles (UAVs) and other mobile systems, e.g., for future tactical superiority. The desire to achieve cognitive capabilities is also applicable in anti-access aerial denial (A2AD) environments where the systems cannot be easily controlled remotely and, thus, operate autonomously.

Neuromorphic computing presents a promising avenue for reducing power consumption of cognitive agents to a level that is suitable for UAVs. Recent systems with neuromorphic processes utilize a convolutional neural network that can carry out 1000 searches per second using around 0.1 Watts (W) of power (as compared to an NVIDIA GPU or Intel® Xeon processor, which may use approximately 100 W or more).

According to certain aspects of the present disclosure herein, memristors are utilized to present a new approach to obtain significantly higher volume of knowledge into a neuromorphic chip, and yet achieve much lower power than more conventional alternatives. For instance, certain embodiments herein can be used to implement memristor based Cognitively Enhanced Complex Event Processing (CECEP) architectures.

A memristor is a non-volatile two-terminal passive circuit element with a wide programmable resistance range. Memristors can be laid out in a high-density grid known as a crossbar. As discussed herein, a memristor that is set to Ron is set to a low resistance (near zero ohms) and a memristor set to Roff is set to a high resistance. Thus, when two conductive items (e.g., a row and a column of a crossbar circuit) are coupled by a memristor, if the memristor is set of Ron, then there is a low resistance connection between the two conductive items, but if the memristor is set of Roff, then there is a high resistance connection between the two conductive items. These crossbars can be used to produce high density low-power hardware capable of performing many parallel multiply-add operations in the analogue domain. Because memristors are nonvolatile, unlike complementary metal oxide semiconductor (CMOS) systems, memristors do not lose data when powered off. Thus, if memristors are used in deployed systems (e.g., in UAVs, etc.) that include a ternary content addressable memory (TCAM), then those systems do not need an extra hard disc to store TCAM knowledge. Also, if memristor TCAMs (as described herein) are accessed less frequently, then their overall energy consumption is lower than CMOS TCAMs. This is because memristor TCAMs do not consume energy for maintaining their state and, hence, consume less energy than their CMOS counterparts. At frequencies that are lower than 1 MHz, a memristor TCAM is approximately 20 times more energy-efficient than corresponding CMOS TCAMs.

Another benefit to memristor TCAMs is that they can be stacked in multiple layers, thereby achieving higher densities without adversely affecting temperature. This is more challenging with CMOS TCAMs because the static energy loss increases the energy density, thereby making CMOS-based TCAMs more difficult to cool than memristor TCAMs.

Several embodiments of the invention as disclosed herein (also designated as "this work") present a memristor crossbar-based technique, e.g., for highly parallel string matching. An input string can be simultaneously compared against a bank of stored words, each having a different length, due to the self-biasing nature of the crossbar circuit. This string-matching system essentially acts as a ternary content addressable memory (TCAM). In certain embodiments, because of the high-density nature of nanoscale memristor crossbars used herein, such systems can provide a significant area reduction when compared alternative TCAM designs while remaining competitive in terms of timing and energy. In some embodiments, depending on operation frequency, memristor crossbars herein also provide a significant reduction in power while remaining competitive in search time.

In some embodiments, this work presents a memristor-based, highly parallel technique for simultaneously comparing input data against a bank of stored words. This type of system can be extremely useful for intrusion detection applications where packets must be scanned to determine if those packets include a malicious instruction. Such an embodiment can also be used as a TCAM, where a particular crossbar column output indicates a location (if any) of data matching an input string.

Because of the high-density nature of nanoscale memristor crossbars, this system can provide significant area reduction when compared to even the most compact TCAM designs, while remaining competitive in terms of timing and energy. Moreover, some embodiments include a memristor TCAM structure that requires zero transistors within each bit-cell.

Example Circuit of a Single Memristor Column

Referring now to the drawings, and in particular to FIGS. 1A-B, embodiments of a circuit 100 is illustrated that provides a basis for ternary matching. As illustrated in FIGS. 1A-B, the circuit 100 includes two implementations of the same circuit components, including a first circuit diagram and programming layout 102, which generates an output Vout, and a second circuit diagram and programming layout 104, which generates the output Vout. In particular, the first circuit diagram and programming layout 102 shows memristor values programmed for matching a precise example of [01 . . . 0] 106, while the second circuit diagram and programming layout 104 shows memristor values programmed with "don't care" values [0x . . . x] 108.

In the illustrated example, if an input string contains N bits, then the string-matching system includes 4N+2 memristors per column. For each bit, the system includes a memristor connection to an input voltage signal X, a second memristor connection to an input voltage signal complement $\overline{X}$ (thus, the input voltage signal is inverted before reaching this memristor) and two biases 110, 112. Further, there are two bias voltages 114, 116 at the end of the column 102. The size of the structure can be significantly reducible by using only two bias rows 114, 116 overall, with each corresponding memristor being programmed to a very precise resistance. For such embodiments, correct functionality can be achieved with two resistance states. Thus, there is a tradeoff between how precise the resistors need to be and the size of the crossbar.

Further, the biasing memristors 110, 112 of one of the bits (e.g., the last bit) are counteracted by the last two biasing memristors 114, 116 in the column. Therefore, it is possible to remove all four of those memristors (i.e., the biasing memristors in the last bit and the biasing memristors in the column). Thus, in this type of embodiment, there are N−1 biased bits per word, where a biased bit includes all four memristors (x, $\overline{x}$, and two bias memristors), and one general bit that includes two memristors (x and $\overline{x}$) but not necessarily the two biasing memristors. If the biasing memristors are added to the general bit, then two biasing memristors should be added to the column. Further, the general bit may be any bit of the N bits (e.g., first, last, anywhere in the middle).

The memristors are programmed in such a way that when there is a match between a bit of the input vector X and the corresponding four memristors of the column, an output of that bit in the column is a zero. Note that the column will have a same voltage over the entire column. Further, only memristors that have Ron (instead of Roff) affect the voltage of the column. Thus, when there is a match for a bit, there is no real effect on the voltage (i.e., the voltage of the column is in equilibrium), but when there is mismatch, then the voltage becomes a non-zero number, which is discussed below in greater detail in reference to FIGS. 2A-B. The last two bias inputs 114, 116 disrupt this equilibrium so that Vcol is positive when an exact match is present and that Vcol is negative for all other cases. However, if one of the values in a target word is irrelevant to the search (known in this work as a "don't care" value or "don't care" bit) as in the second circuit diagram and programming layout 104 (e.g., for use in a TCAM), then all four memristors corresponding to that bit are set to the Roff state. Thus, the input voltages corresponding to any "don't care" bit are neutralized (i.e., those memristors do not affect the output voltage). This same method can be used for storing words of variable length within one crossbar; the unused last bits are put into a don't care value configuration. Thus, the crossbar is a self-biasing crossbar because this programming approach allows for a voltage after the final two bias voltages 114, 116 (Vcol) to be compared to a zero volt source for matching no matter what data pattern or data length is stored in a particular column.

Figures 2A, 2B:
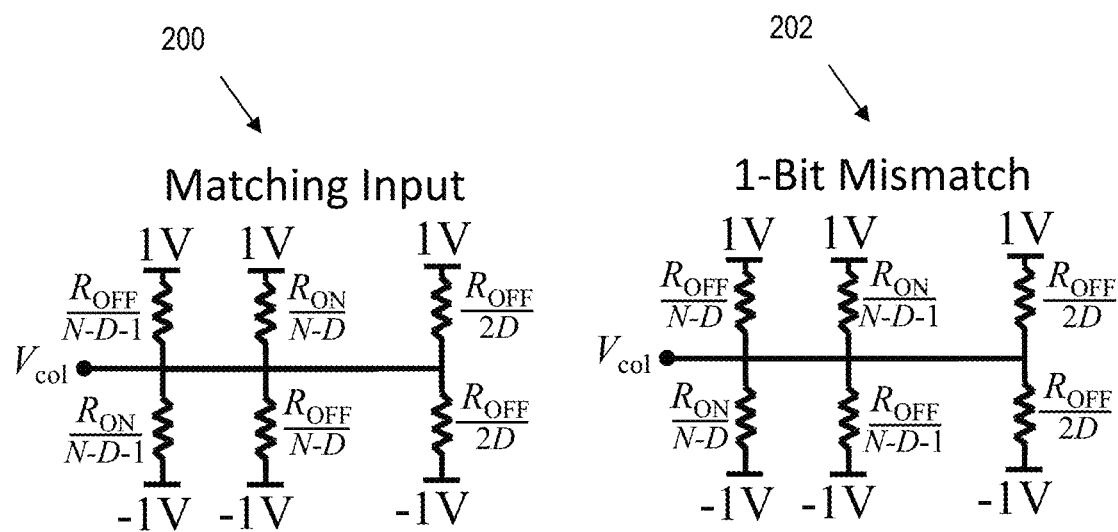
FIG. 2A shows one embodiment of a circuit showing equivalent resistances for a match in a memristor matching column circuit.
FIG. 2B shows one embodiment of a circuit showing equivalent resistances for a mismatch in a memristor matching column circuit.

Referring to FIG. 2A and FIG. 2B taken together, example equivalent circuits are illustrated for a memristor matching column circuit according to aspects of the present disclosure, where the circuit of FIG. 2A displays equivalent resistances for a match and the circuit of FIG. 2B displays the equivalent resistances for a one-bit mismatch, to illustrate how equivalent resistance values shift based on different inputs.

Referring specifically to FIG. 2A, in the circuit 200, a match forces Vcol slightly positive, as a number of the memristors set to RON (N-D) connected to a one-volt source outnumbers a number of memristors connected to the negative-one-volt source (N-D-1, i.e., one less than N-D), where memristors set to Roff mirror this pattern to uphold symmetry around zero, to produce a zero at Vcol of FIG. 2A.

Referring to FIG. 2B, in the circuit 202, the voltage at Vcol is slightly less than zero volts, as the opposite resistance setting is observed. From this, it can be logically seen that any mismatch with greater than a one-bit difference will push Vcol further below zero volts, thereby resulting in an even easier mismatch identification.

An advantage of such an architecture is that each column in a memristor crossbar is used to replicate the circuit 100 in FIG. 1. Thus, a set of inputs can be applied to a memristor crossbar and checked against several target words simultaneously.

Example Memristor-Based TCAM

Figure 3:
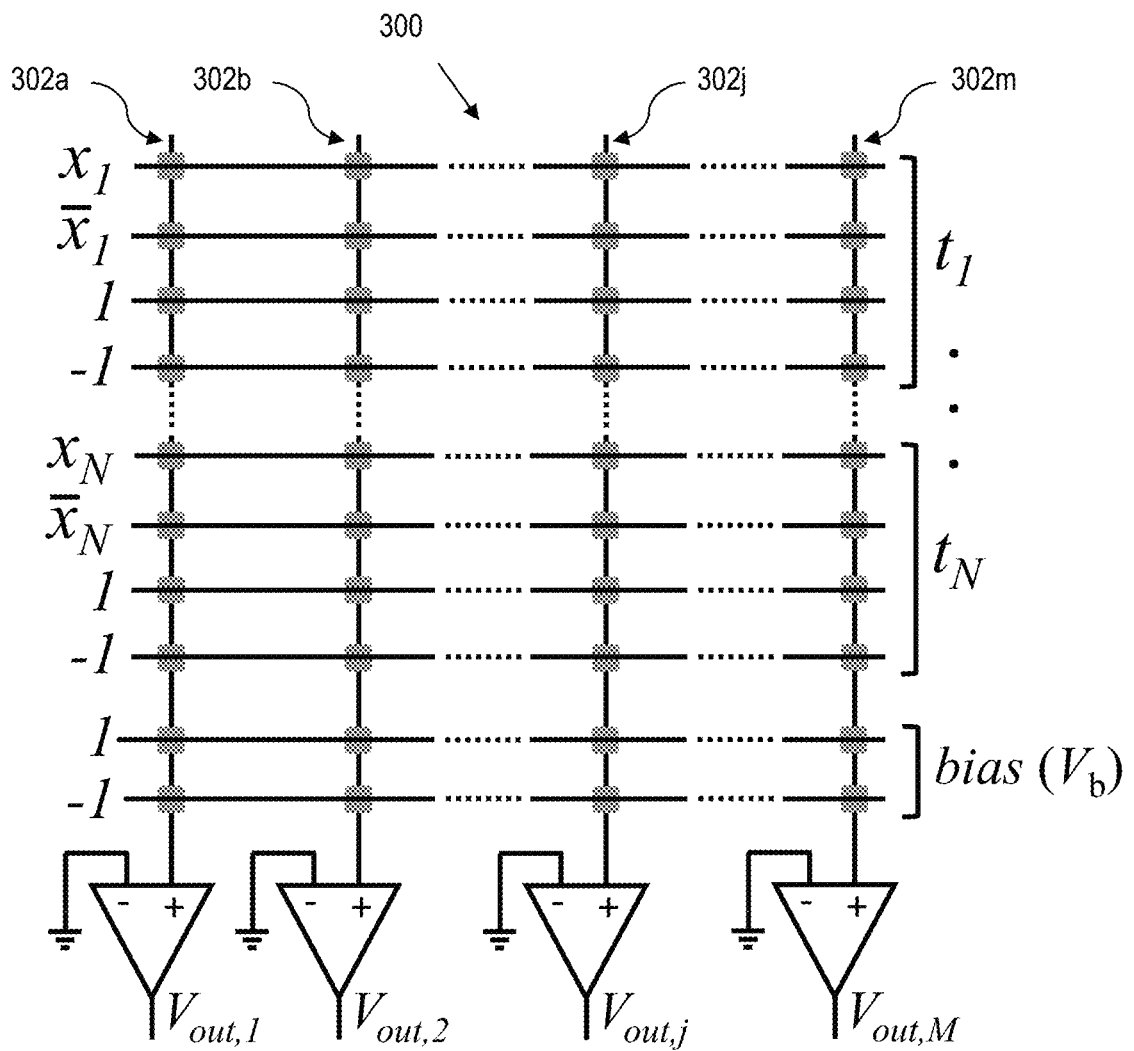
FIG. 3 shows one embodiment of a memristor crossbar circuit where each column is capable of storing a different target word for matching.

Referring to FIG. 3, a memristor crossbar representation 300 is illustrated where each column 302a-m is capable of storing a different target word for matching. In an example implementation, a crossbar representation 300 of this system is displayed, where a match between the input and M different words can be checked in parallel.

Because the memristor crossbar of FIG. 3 can essentially be used as a TCAM, the proposed design is analyzed to see how it compares to alternatives in terms of timing, area, and energy. To properly analyze the performance, a peripheral complementary metal oxide semiconductor (CMOS) circuitry is designed.

Figure 4A:
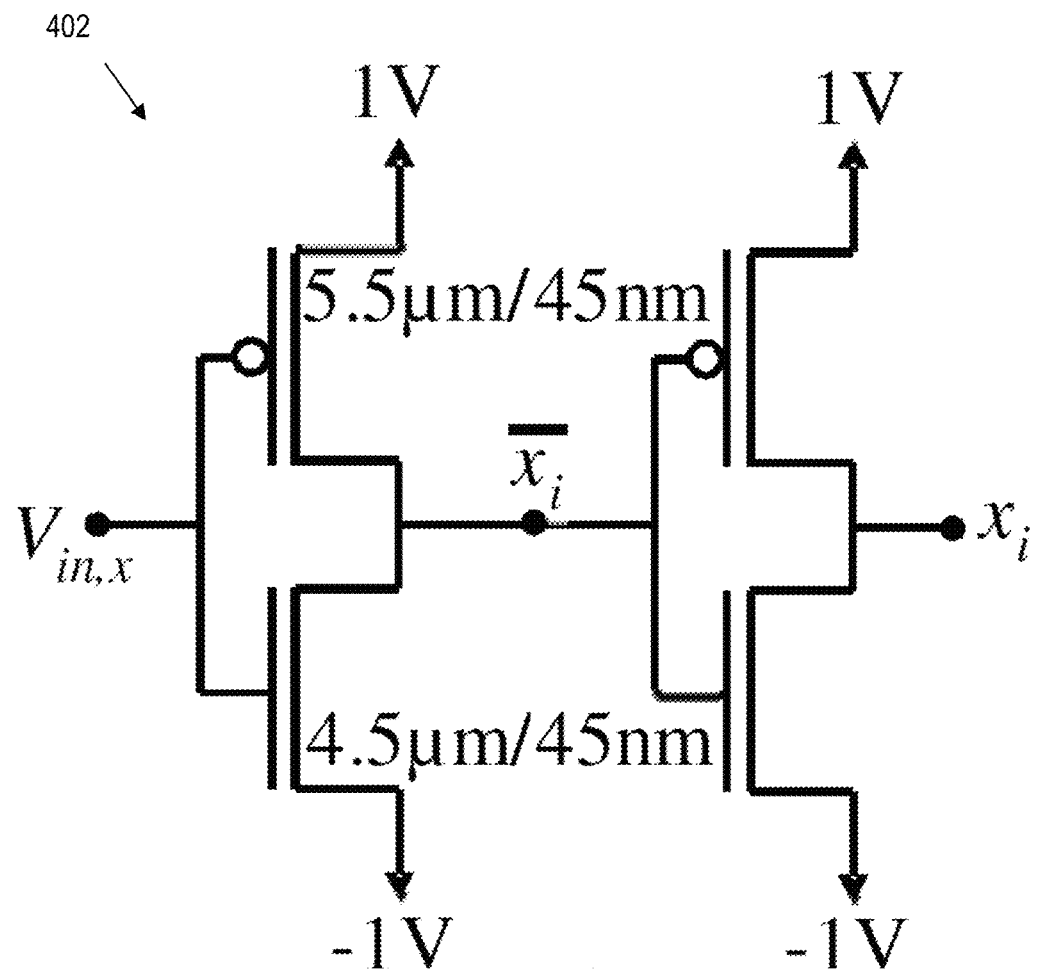
FIG. 4A shows one embodiment of a peripheral driver circuit for data inputs.
Figure 4B:
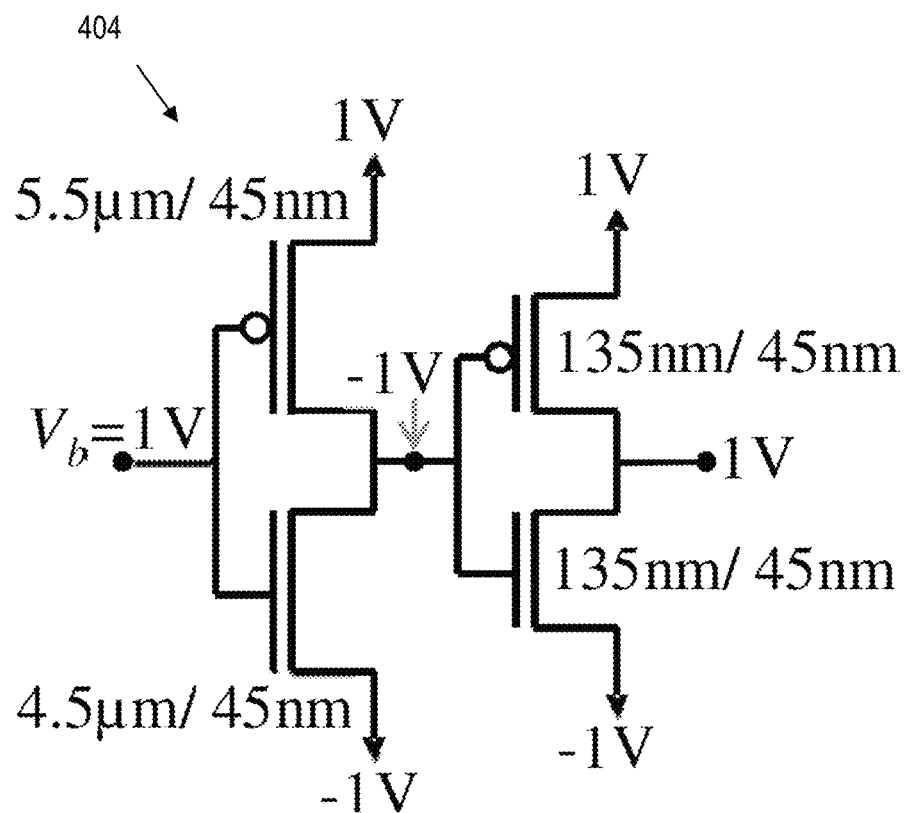
FIG. 4B shows one embodiment of a peripheral driver circuit for bias inputs.
Figure 4C:
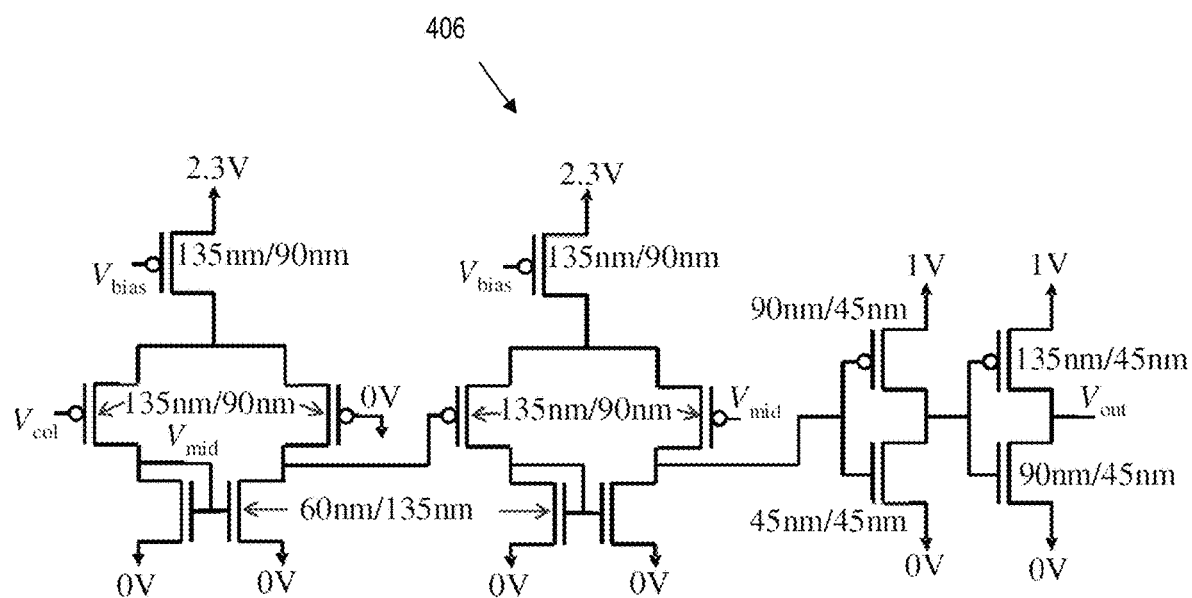
FIG. 4C shows one embodiment of a peripheral comparator circuit for crossbar outputs.

Referring briefly to FIGS. 4A-C the CMOS circuits include drivers located at the crossbar row inputs, and the comparators at the crossbar column outputs. In particular, FIG. 4A illustrates an example driver 402 for data inputs. FIG. 4 illustrates an example driver 404 for bias inputs. FIG. 4 illustrates an example comparator 406 for crossbar outputs.

Simulation Program with Integrated Circuit Emphasis (SPICE) analysis of these circuits was performed to determine accurate power and timing values. The crossbar input drivers and output comparator circuits were designed and simulated using the 45 nm PTM HP model, as done by Arizona State University Nanoscale Integration and Modeling (NIMO) Group, <http://ptm.asu.edu/>.

The memristors were simulated with the assumption that they held the properties of the device in M. N. Kozicki, M. Balakrishnan, C. Gopalan, C. Ratnakumar, M. Mitkova, Programmable metallization cell memory based on Ag—Ge—S and Cu—Ge—S solid electrolytes, in: Proceedings of Non-Volatile Memory Technology Symposium, 2005, pp. 83-89, where RON=500 kΩ and an Roff/Ron ratio of at least 100 is observed.

As noted above, the resulting designs for the peripheral circuits are displayed in FIGS. 4A-C. The drivers 402 (FIG. 4A) and 404 (FIG. 4B) in this embodiment are large enough to supply the worst case current, which occurs when each memristor in a row is set to RON (see FIG. 4A). However, several rows (approximately 25%) are connected to a constant bias where all memristor in that row will be set to Roff so that these drivers can be reduced in size (see FIG. 4B). The illustrated comparator 406 in FIG. 4C was optimized for switching time given the relatively small voltage changes that it senses to determine a match. All sizes in FIGS. 4A-C are displayed as W/L (width/length).

Memristor-Based Look-Up Table

Referring back to FIG. 3, look-up tables (LUT) can be very efficiently implemented using ternary content addressable memories (TCAMs). Aspects of the present disclosure provide a new memristor-based TCAM circuit (memristor-based LUT) as illustrated in FIG. 3, which can potentially pack over a thousand times more knowledge per unit area compared to existing CMOS TCAM circuits.

The following example is used to illustrate use of the TCAM of FIG. 3 as a look-up table for determining a car to purchase. In the example, there are six inputs (year, mileage, horsepower (HP), type, country, and price) and one output (recommended model of car). The following values are available for each of the inputs, where the number in parentheses indicates how many values are available:
year: 2016 (1);
mileage: below_25 k, between 25 k and 35 k, above 35 k (3);
HP: 160-180, 181-200, 201-220, 221-240, and 241+(5);
type: sedan, midsize sport-utility vehicle (SUV), and luxury coup (3);
country: Japan, U.S.A., South Korea, and Germany (4);
price: $21 k-$23 k, $29 k-$32 k, and $38 k-$43 k (3).

Thus, there are a total of nineteen different values for the six inputs. Thus, the input string is nineteen bits long, so there are (4*19)+2 memristors for each column of the look-up table.

Further, the model output includes twelve classes as values:
class 1: honda_accord, nissan_altima, mazda_mazda6;
class 2: toyota_camry, Subaru_legacy;
class 3: chevrolet_malibu;
class 4: ford_fusion;
class 5: chrysler_200;
class 6: kia_optima, hyundai_sonata;
class 7: honda_pilot, toyota_highlander;
class 8: dodge_durango; ford_explorer;
class 9: audi_a5;
class 10: bmw_4-series;
class 11: lexus_rc;
class 12: infinity_q6.

To generate the lookup table, a nineteen-bit combination that corresponds to each of the twelve classes are recorded. For example, if the nineteen-bit input is "1100010001001000100", then the following values are applied to the six categories:
year: 2016
mileage: above 35 k
HP: 181-200
type: sedan
country: Japan
price: $21 k-$23 k For purposes of the example, class 1 is defined as "1100010001001000100" and class 2 is defined as "1100100001001000100" (i.e., 2016, above 35 k, 160-180, sedan, Japan, $21 k-$23 k). The other ten classes are also defined as a specific string but are omitted herein for the sake of brevity. All twelve of the classes can be evaluated at the same time (i.e., in parallel) with each class being a column in the crossbar. As discussed above, more mismatches on individual bits drive the overall voltage of a column more away from equilibrium. However, with the final biasing memristors, a match on all bits with produce a positive voltage.

Memristor State Machine Example

The architectures disclosed herein may also be used to create state machines. For example, assume a 3-bit state machine (x, y, z) includes the following state equations, where x, y, and z represent a current of the three bits; x', y', and z' represent a next state; and w represents an input:

$$x'=x\bar{y}+\bar{x}y+w;$$

$$y'=yw+xz;\text{ and}$$

$$z'=yz+\bar{w}.$$

A state transition table for the example state machine of the equations above would be:

|   |   |   | w |   |
|---|---|---|---|---|
| x | y | z | 0 | 1 |
| 0 | 0 | 0 | 001 | 100 |
| 0 | 0 | 1 | 001 | 100 |
| 0 | 1 | 0 | 101 | 110 |
| 0 | 1 | 1 | 101 | 111 |
| 1 | 0 | 0 | 101 | 100 |
| 1 | 0 | 1 | 111 | 110 |
| 1 | 1 | 0 | 001 | 110 |
| 1 | 1 | 1 | 111 | 111 |
|   |   |   | x*y*z* | x*y*z* |

Figure 5A:
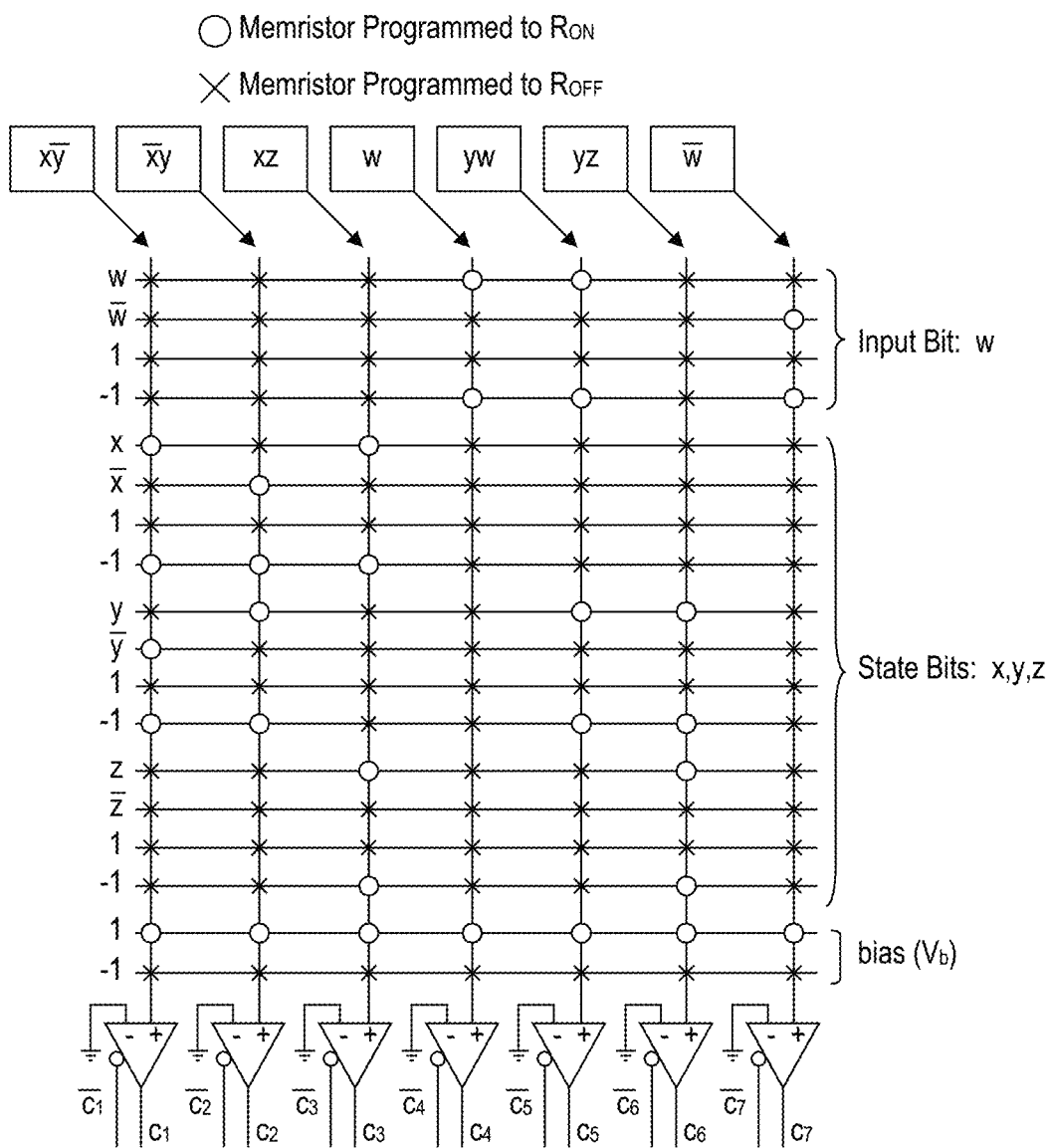
FIGS. 5A-B illustrate using two crossbar circuits as a state machine, according to various aspects of the present disclosure.

To build a state machine using memristor-based crossbar circuits, two crossbar circuits may be used. A first crossbar circuit is used to determine products of the equations for the state machine. For example, using the three next-state equations above, there are four parallel inputs: x, y, z, and w. Further, there are seven unique products: $x\bar{y}$, $\bar{x}y$, w, yw, xz, yz, and $\bar{w}$. Thus, a four-bit, seven-column crossbar circuit may be used to emulate the equations. Such a crossbar circuit 502 is shown in FIG. 5A.

Figure 5B:
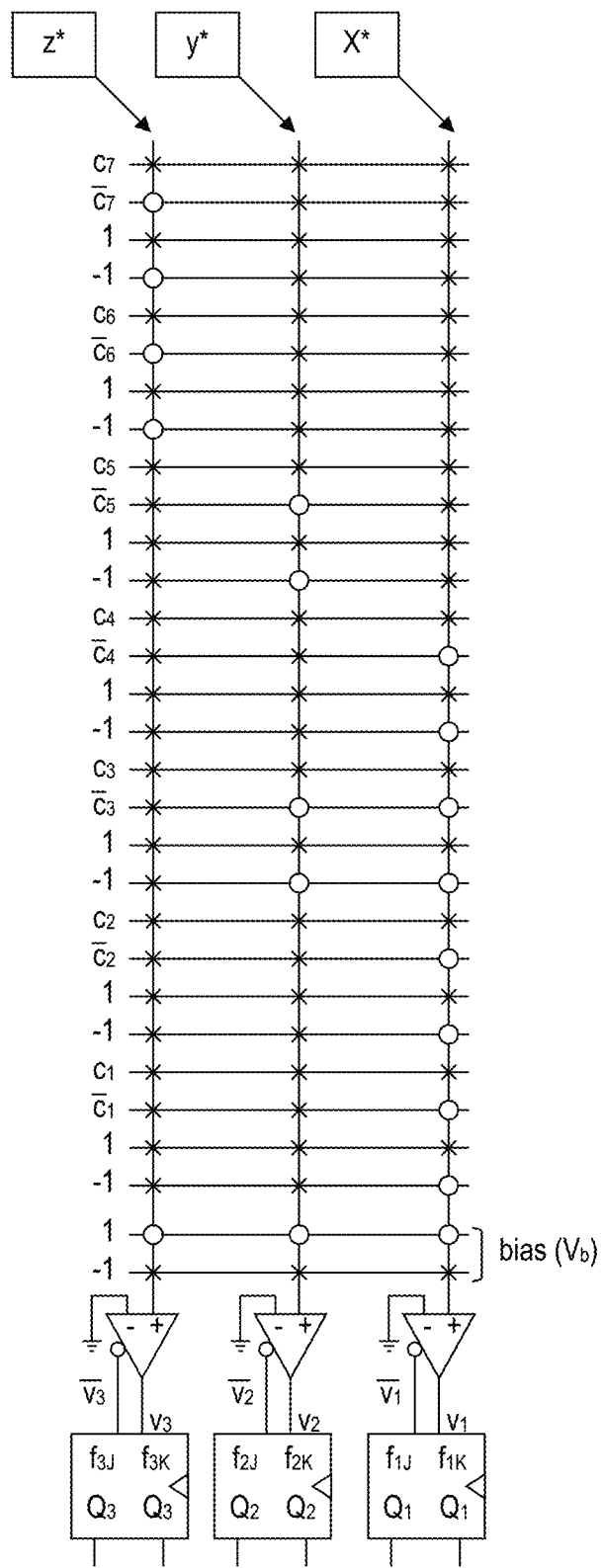

Further, a second crossbar circuit may be used as an input to flipflops for the state machine. For example, the seven outputs (i.e., the products of the equations) of the crossbar circuit 502 of FIG. 5A are used as inputs to the second crossbar circuit to give the state transitions. Thus, the second crossbar circuit 504 includes three columns (one for each bit of the state machine) and seven rows (one for each product) as shown in FIG. 5B. The columns of the second crossbar circuit feed flipflops 506, 508, 510. Therefore, the outputs of the first crossbar circuit are used as inputs to the second crossbar circuit, and the flipflops and the input bit are used as inputs to the first crossbar circuit.

Comparison of Present TCAM with Existing TCAMs

Referring to FIG. 6, a table, identified as Table 1 shows a comparison between the TCAM developed using the circuits herein (designated as "This Work") shows a comparison between the TCAM developed using the memristor structures herein, two CMOS alternatives, as well as two non-volatile memory-based approaches. In Table 1, a normalized area factor equalizes different technology nodes.

More particularly, Table 1 shows a comparison between the memristor structures described herein and: (a) a CMOS alternative by Kim et al., (as shown in Y.-D. Kim, H.-S. Ahn, J.-Y. Park, S. Kim, and D.-K. Jeong, "A storage- and power-efficient range-matching TCAM for packet classification," in IEEE Int. Solid-State Circuits Conf. (ISSCC) Dig., 2006, pp. 587-596); (b) another CMOS alternative by Huang et al (as shown in P.-T. Huang and W. Hwang, "A 65 nm 0.165 fJ/Bit/Search 256 144 TCAM," IEEE J. of Solid State Circuits 46(2), February 2011, pp. 507-519); (c) a non-volatile memory-based approach implemented as a resistive random access memory (RRAM) alternative by Zheng et al (as shown in L. Zheng, S. Shin, S. Lloyd, M. Gokhale, K. Kim, S.-M. Kang, "RRAM-Based TCAMs for Pattern Search," IEEE ISCAS, p. 1382-1385, 2016); and (d) a non-volatile memory-based approach implemented as a magnetic magnetoresistive random access memory (MRAM) alternative by Xu et al. (as shown in W. Xu, T. Zhang, Y. Chen, "Design of Spin-Torque Transfer Magnetoresistive RAM and CAM/TCAM with High Sensing and Search Speed" IEEE Trans. on VLSI Systems, 18(1), p. 66-74, January, 2010).

The disclosed embodiment implemented a 256×144 TCAM structure (meaning that the system can determine if there are any matches of an input string of 144 bits with a bank of 256 words).

When comparing results of the disclosed embodiments with existing alternatives (as shown in Table 1 of FIG. 6), the disclosed embodiments showed a significant area reduction while remaining comparable in terms of time and energy. This is because of the high density provided by the proposed memristor crossbar. In certain embodiments herein, the memristor crossbar can be patterned on top of the CMOS driver and comparator circuits displayed in FIGS. 4A-C. In other embodiments, the memristor crossbar may be adjacent or below the CMOS driver, as desired. Because the total area of the crossbar is larger than that of the CMOS circuitry, the total area for this TCAM core is 0.0012 mm$^2$ (assuming a 45 nm wire width and a 25% packing density). The total area of the surrounding CMOS circuitry is 4.55×10$^{-4}$ mm$^2$ which was obtained by adding the gate areas of the circuits in FIGS. 4A-C and then multiplying to obtain the correct number of each circuit used. This area was then doubled to provide a factor of safety, assuming that more than gate area alone is required to layout the CMOS circuitry. Because this is less than half of the area of the crossbar, there should be plenty of room for more spacing, or additional control circuitry if needed.

The proposed embodiments are able to provide a search time that falls in between the two CMOS examples by Kim et al or Huang et al (provided for comparison), and a search energy that is slightly higher. Furthermore, the proposed embodiments result in lower energy, area, and access time when compared to corresponding RRAM and MRAM alternatives. The search time for the disclosed embodiments can be shortened by increasing comparator voltage, and power is reducible by increasing minimum memristor resistance. However, due to parasitic capacitances, increasing the resistance range may produce a power-delay trade off that can be optimized for performance.

TCAM Power Consumption v. Frequency

Figure 7:
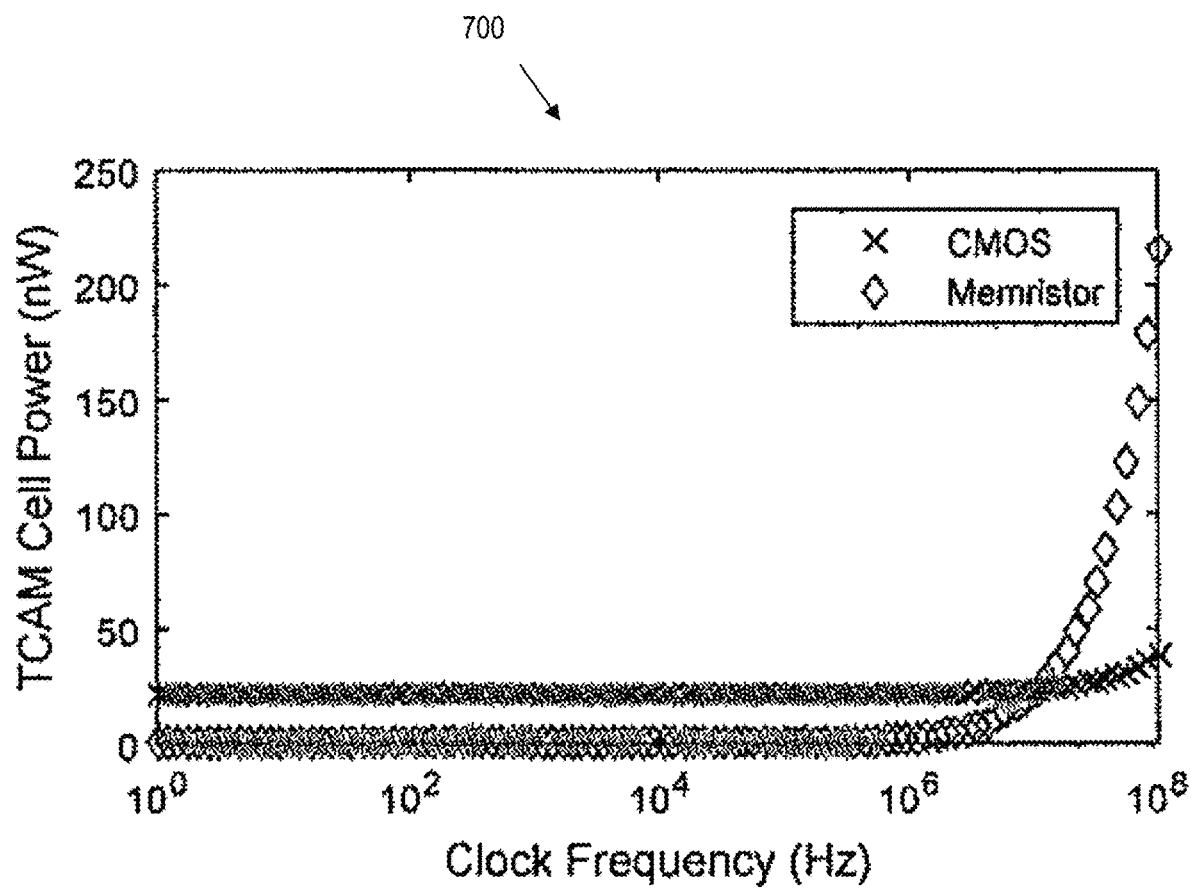
FIG. 7 shows a chart comparing power for one embodiment of the disclosed memristor power with power for a complementary metal oxide semiconductor (CMOS) alternative.

Referring to FIG. 7, a chart 700 illustrates a comparison of TCAM cell power for the memristor design and a CMOS alternative. Notably, if search functions operate at a frequency that is below 10 MHz, then the disclosed memristor system, according to certain embodiments herein, is more power efficient than corresponding CMOS systems. For instance, in the example embodiment of FIG. 7, when accessing the memories at less than one-MHz rate, the memristor TCAM is actually about 20 times more energy efficient than the CMOS TCAM.

In some embodiments, the circuits herein are very energy efficient, even though search energy is a bit higher than some alternatives. For instance, a memristor design herein has a slightly higher search energy, but effectively no data storage energy (because memristors are nonvolatile). Therefore, if the search function is operating at a frequency below about 10 MHz, the proposed memristor system will be more power efficient.

Miscellaneous

As shown herein, the disclosed memristor crossbar-based technique provides for highly parallel string matching and permits an input string to be simultaneously compared against a bank of stored words, each having a different length, due to the self-biasing nature of the crossbar circuit. This string-matching system acts as a TCAM. Because of the high-density nature of nanoscale crossbars, this system can provide a significant area reduction when compared alternative TCAM designs while remaining competitive in terms of timing and energy.

Although exemplary embodiments have been shown and described, it will be clear to those of ordinary skill in the art that a number of changes, modifications, or alterations to the disclosure as described may be made. For example, one embodiment is a circuit configured for an input string of N bits, wherein N is an integer greater than zero. The circuit comprises columns of memristors, with each column comprising 4N inputs arranged as a crossbar to the columns. Each 4N input corresponds to one of the N bits. The circuit further comprises a positive bias source electronically coupled to each column and, also, a negative bias source electronically coupled to each column. In one embodiment, the circuit further comprises a data driver for data input, a bias driver for bias input, and a comparator for crossbar outputs. In some embodiments, the data driver, the bias driver, and the comparator comprise CMOS circuits. Although examples of such CMOS circuits are shown in FIGS. 4A-C, it should be appreciated that other configurations are possible. All such changes, modifications, and alterations should therefore be seen as within the scope of the disclosure.

The parallel circuit design herein (e.g., which may utilize completely parallel analog signals) is unique and enables an achievement of areal density that cannot be approached by conventional circuits. Moreover, conventional circuits require the presence of some kind of active select device within a TCAM unit cell. However, aspects of the present disclosure provide circuits that do not require the presence of an active select device within a TCAM unit cell. Moreover, circuits herein are capable of operating without memory cell access transistors, whereas certain conventional circuits require memory cell access transistors.

Notably, designs herein can be generalized to TCAMs, which provides an advantage over certain alternative circuits that are limited to content addressable memory (CAM). For instance, TCAMs can do everything a CAM can do, except they have the option of turning off specific bits during a search, allowing for a more complex and versatile matching function.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the invention in the form disclosed. Many modifications and variations will be apparent to those of ordinary skill in the art without departing from the scope and spirit of the invention. Aspects of the disclosure were chosen and described in order to best explain the principles of the invention and the practical application, and to enable others of ordinary skill in the art to understand the invention for various embodiments with various modifications as are suited to the particular use contemplated.

What is claimed is:

1. A crossbar circuit to determine a match of N bits of data to at least one of M target words, the circuit comprising:
    N inputs, each corresponding to an associated bit of the N data bits;
    for each of the M target words:
        N−1 biased bits, where each biased bit includes:
            a first data memristor coupled to a corresponding one of the N inputs;
            a second data memristor coupled to the corresponding one of the N inputs, where the corresponding one of the N inputs is inverted before reaching the second data memristor;
            a first biasing memristor coupled to a first voltage; and
            a second biasing memristor coupled to a second voltage; and
        a general bit comprising:
            a first data memristor coupled to the input that does not correspond to any of the biased bits; and
            a second data memristor coupled to the input that does not correspond to any of the biased bits, where the input that does not correspond to any of the biased bits is inverted before reaching the second data memristor;
        wherein the memristors are coupled to a column; and
    M outputs, where each output is coupled to a corresponding column of the columns.

2. The crossbar circuit of claim 1, wherein:
    for each of the M target words:
        for each of the biased bits:
            the first memristor is set to Ron if a corresponding bit of the corresponding target word is a one; and
            the second memristor is set to Roff if the corresponding bit of the corresponding target word is a one;
        the first memristor of the general bit is set to Ron if the corresponding bit of the corresponding target word is a one; and
        the second memristor of the general bit is set to Roff if the corresponding bit of the corresponding target word is a one.

3. The crossbar circuit of claim 1, wherein:
    for each of the M target words:
        for each of the biased bits:
            the first memristor is set to Roff if a corresponding bit of the corresponding target word is a zero; and
            the second memristor is set to Ron if the corresponding bit of the corresponding target word is a zero;
        the first memristor of the general bit is set to Roff if the corresponding bit of the corresponding target word is a zero; and the second memristor of the general bit is set to Ron if the corresponding bit of the corresponding target word is a zero.

4. The crossbar circuit of claim 1, wherein:
for each of the M target words:
  for each of the biased bits:
    the first memristor is set to Roff if a corresponding bit of the corresponding target word is a don't care; and
    the second memristor is set to Roff if the corresponding bit of the corresponding target word is a don't care;
  the first memristor of the general bit is set to Roff if the corresponding bit of the corresponding target word is a don't care; and
  the second memristor of the general bit is set to Roff if the corresponding bit of the corresponding target word is a don't care.

5. The crossbar circuit of claim 1 further comprising:
for each of the M columns, a comparator is at the end of each column.

6. The crossbar circuit of claim 1, wherein:
each general bit further includes:
  a first biasing memristor coupled to the first voltage; and
  a second biasing memristor coupled to the second voltage; and
each column further comprises:
  a first biasing memristor coupled to the first voltage; and
  a second biasing memristor coupled to the second voltage.

7. The crossbar circuit of claim 1, wherein:
the first voltage is a positive voltage; and
the second voltage is a negative voltage.

8. The crossbar circuit of claim 7, wherein:
the first voltage is a positive one-volt voltage; and
the second voltage is a negative one-volt voltage.

9. The crossbar circuit of claim 1, further comprising:
N data drivers coupled to the N inputs.

10. The circuit of claim 9, wherein the data drivers each comprise a complementary metal oxide semiconductor (CMOS) circuit.

11. The circuit of claim 10, wherein the CMOS circuit comprises:
a positive bias; and
a negative bias.

* * * * *